(12) United States Patent
Podell

(10) Patent No.: US 7,202,760 B2
(45) Date of Patent: Apr. 10, 2007

(54) RESISTIVE VOLTAGE DIVIDER

(75) Inventor: Allen F. Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 68 days.

(21) Appl. No.: 10/858,908

(22) Filed: Jun. 1, 2004

(65) Prior Publication Data

US 2005/0264374 A1    Dec. 1, 2005

(51) Int. Cl.
*H01P 3/08* (2006.01)
*H03H 7/38* (2006.01)
*H03H 7/00* (2006.01)

(52) U.S. Cl. .................. 333/109; 333/33; 333/172

(58) Field of Classification Search .............. 333/21 R, 333/33, 34, 109, 110, 112, 113, 116, 118, 333/124–126, 128, 238, 172
See application file for complete search history.

(56) References Cited

U.S. PATENT DOCUMENTS

| | | | | |
|---|---|---|---|---|
| 3,701,057 A | | 10/1972 | Hoer | ......................... 333/112 |
| 4,205,282 A | * | 5/1980 | Gipprich | ..................... 333/161 |
| 4,935,709 A | * | 6/1990 | Singer | ....................... 333/101 |
| 5,325,064 A | * | 6/1994 | Leanes et al. | ............... 324/638 |
| 6,023,209 A | * | 2/2000 | Faulkner et al. | ............. 333/238 |
| 6,100,750 A | | 8/2000 | Van Der Zee | ............... 327/531 |
| 6,522,223 B1 | * | 2/2003 | Lobl et al. | ................... 333/172 |

OTHER PUBLICATIONS

Hand-drawn sketches by Glenn Werlau, President of Werlatone, Inc. on Nov. 2, 2005, two sheets containing Figures 1-4.

* cited by examiner

*Primary Examiner*—Dean Takaoka
(74) *Attorney, Agent, or Firm*—Kolisch Hartwell, P.C.

(57) ABSTRACT

A radio-frequency impedance device includes a resistor device mounted on a surface of a dielectric layer, and adapted to be connected between a transmission line and an output terminal associated with a load impedance. A ground conductor may extend opposite a portion of the resistor device. Further, a conductor assembly may couple a first end of the resistor device to a transmission line. The conductor assembly may include a first portion extending along the first layer face on opposite sides of the resistor device adjacent to at least the first resistor end, or a second portion extending along the fourth layer face opposite from the ground conductor. The configuration of devices may produce, in operation, an electric field distributed along the resistor device, providing corresponding distributed current density along the resistor device over a broad frequency band.

24 Claims, 5 Drawing Sheets

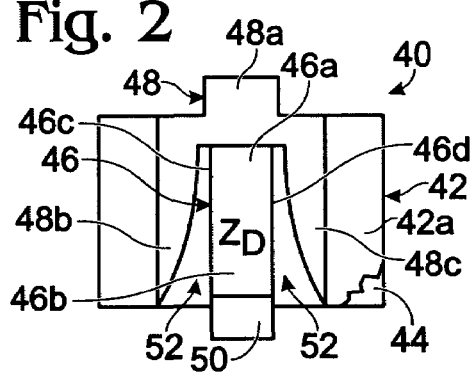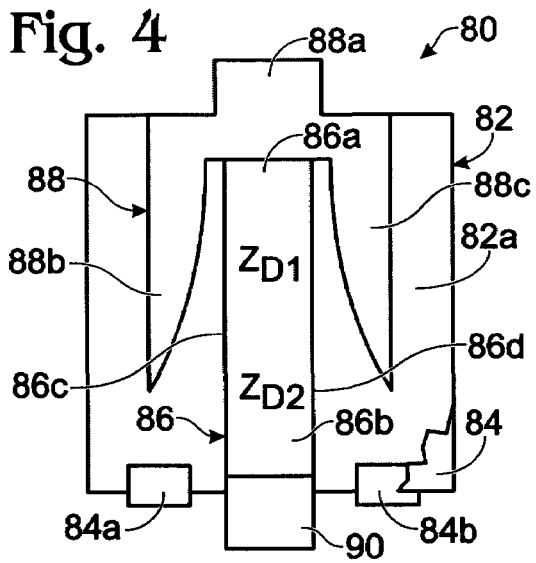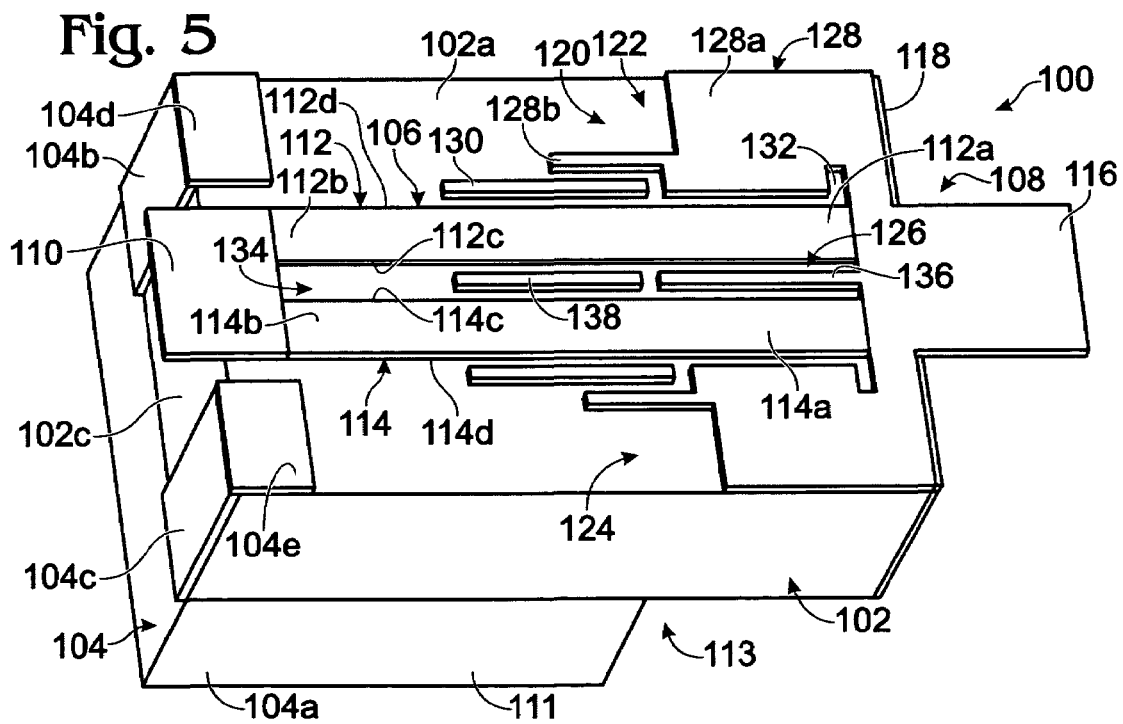

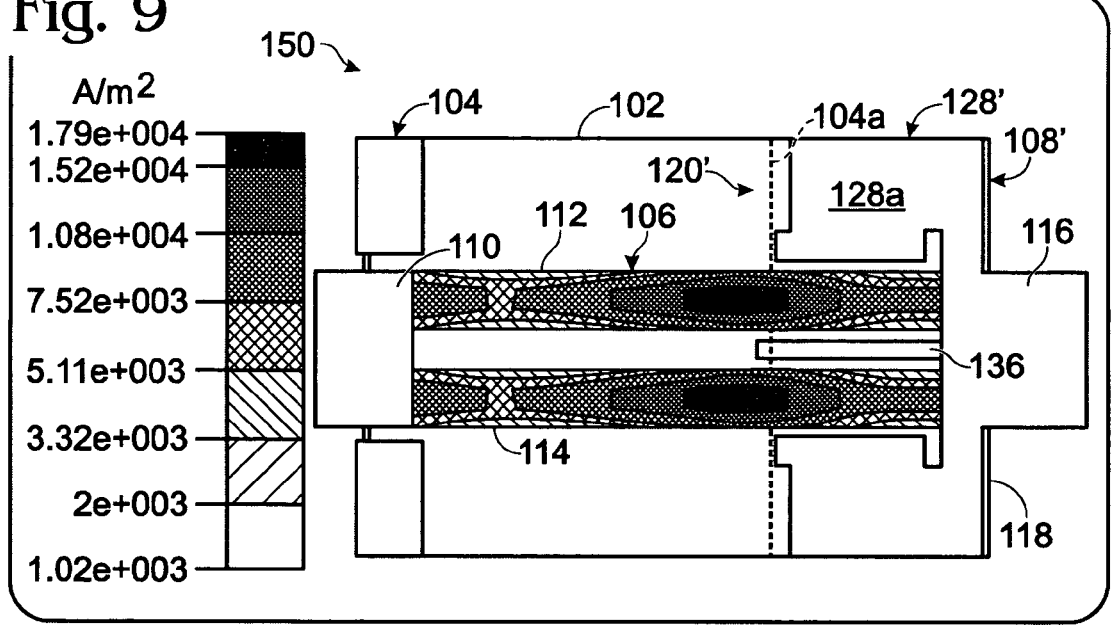
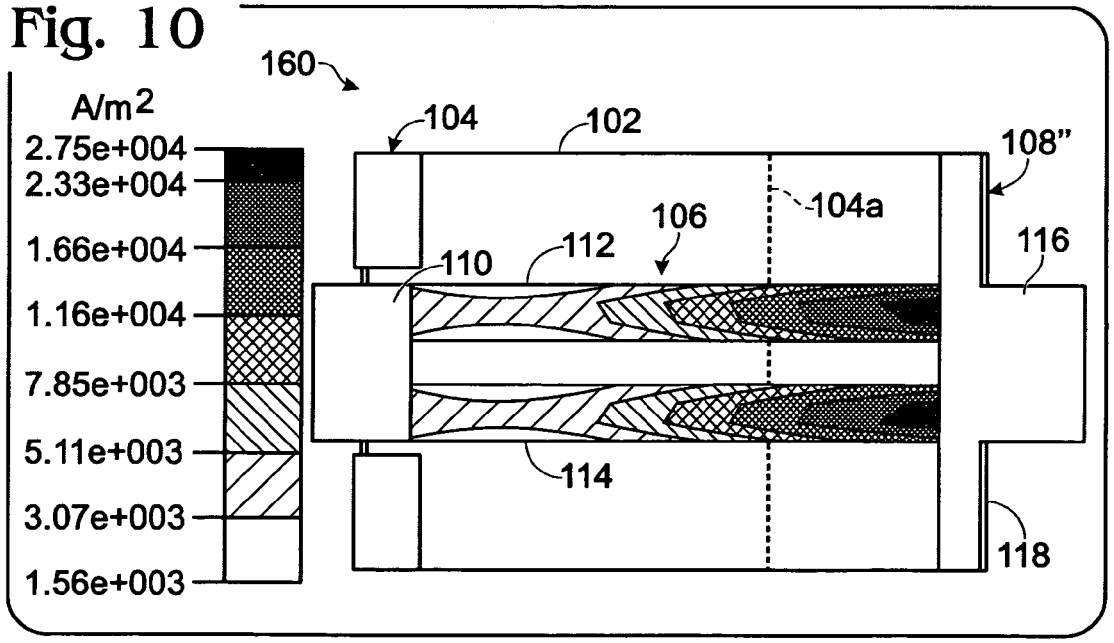

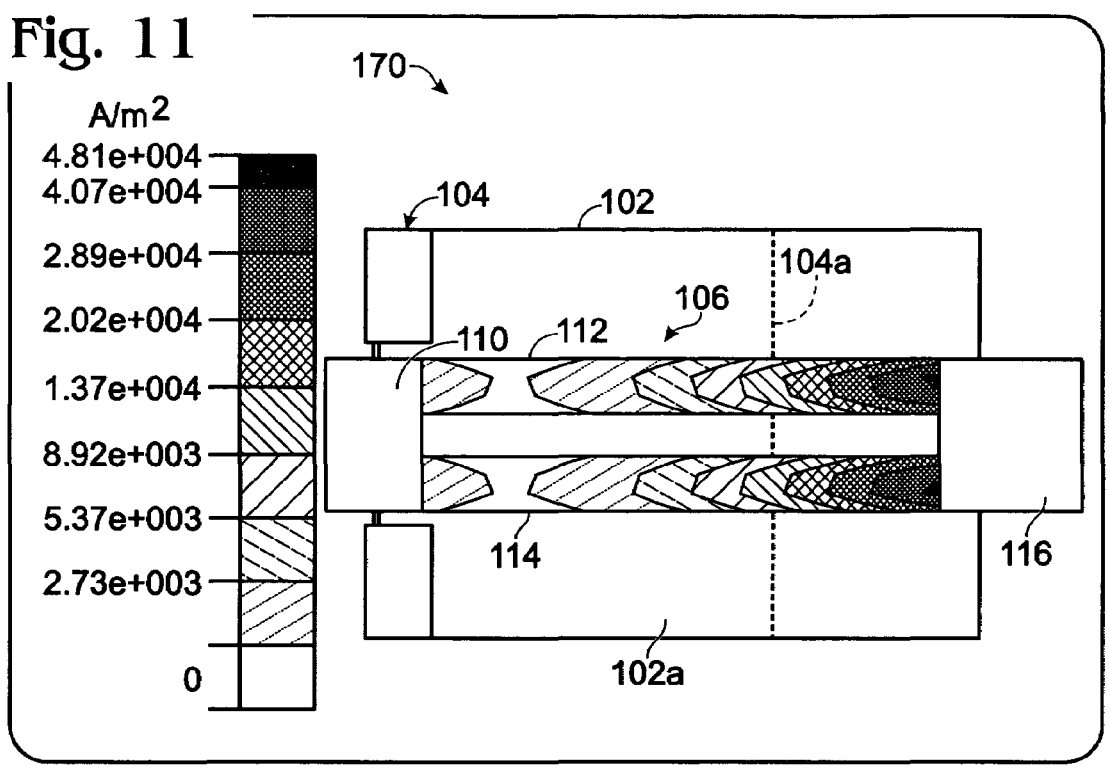
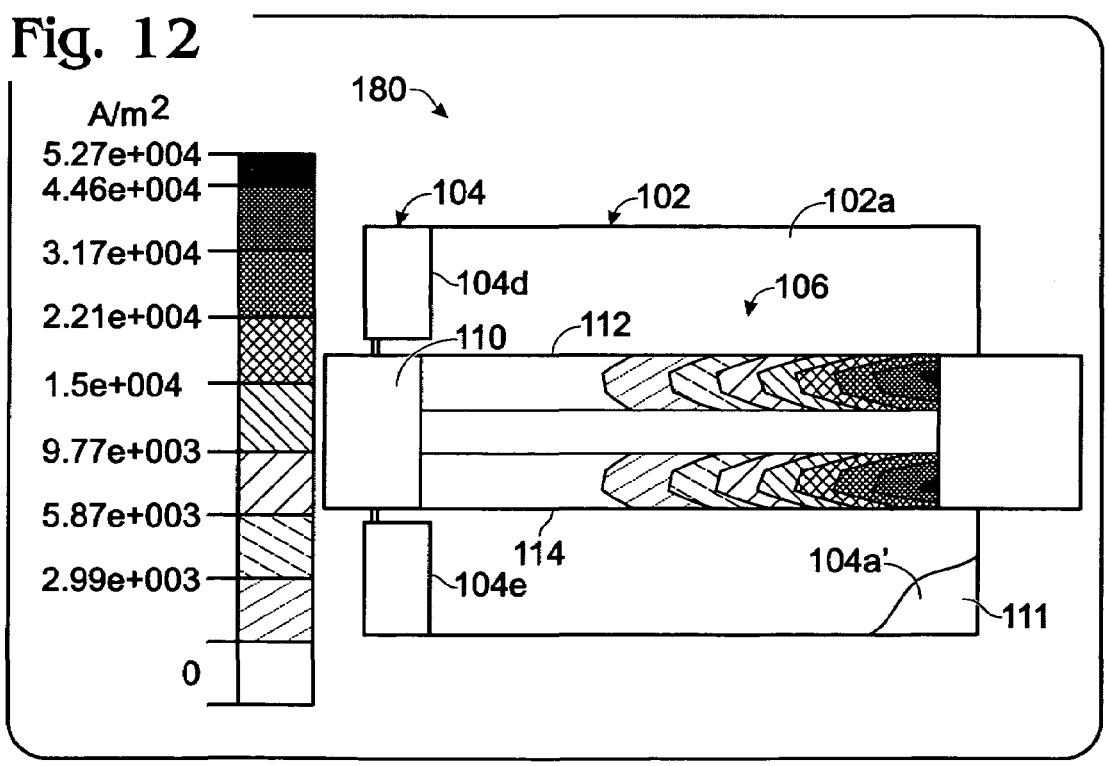

US 7,202,760 B2

RESISTIVE VOLTAGE DIVIDER

BACKGROUND

The present disclosure relates to voltage dividers, and particularly to resistive voltage dividers that may be formed on a dielectric layer, and a directional coupler including such a voltage divider. A voltage divider may be considered a network having impedance elements connected in series, to which a voltage is applied, and from which one or more voltages can be obtained across a portion of the network. Dividers may have parasitic impedances affecting the response. These impedances include capacitance to ground and to neighboring structures at ground or other potentials.

BRIEF SUMMARY OF THE DISCLOSURE

A radio-frequency impedance device, usable in a voltage divider, may include a resistor device mounted on a surface of a dielectric layer, and adapted to be connected between a transmission line and an output terminal associated with a load impedance. A ground conductor may extend opposite a portion of the resistor device. Further, a conductor assembly may couple a first end of the resistor device to a transmission line. The conductor assembly also may extend along opposite sides of the resistor device adjacent to at least the first resistor end, or along a fourth layer face opposite from the ground conductor. The configuration of devices may produce, in operation, an electric field and correspondingly current density distributed along the resistor device, over a broad frequency range.

BRIEF DESCRIPTION OF THE SEVERAL VIEWS OF THE DRAWINGS

FIG. 2 is a plan view of an embodiment of an impedance device usable in a voltage divider similar to the voltage divider of FIG. 1.

FIG. 4 is a plan view of an embodiment of an impedance device usable in a voltage divider similar to the voltage divider of FIG. 3.

FIG. 5 is an isometric view of yet another embodiment of an impedance device.

FIGS. 8–12 are plan views of impedance devices that are variations of the impedance device of FIG. 5 illustrating current density along a commonly configured resistor device.

DETAILED DESCRIPTION OF VARIOUS EMBODIMENTS

A resistive voltage divider has greater applicability if it functions consistently over a broad frequency range. Compensation of parasitic impedances may be provided in a voltage divider mounted relative to a dielectric layer. The frequency response of a resistive divider having a resistor device, such as a resistor film, formed on a dielectric substrate may be relatively flat if the voltage at each spot on the surface of the substrate is the same with or without the resistive film. For a uniform resistive film, which may provide effective power dissipation to a back side ground plane, this implies that the resistor be in an electric field that drops off linearly to zero from the "hot" end to the "cold" end. This is physically possible, because a parallel pair of plates gives such a field shape. The resistive film, however, may have to be aligned perpendicular to the plates.

It may be difficult to dissipate power with this configuration when neither resistor end has a back side ground plane, referred to as being thermally at ground. Any grounded conductor on the back side of the substrate, however thick it may be, will disturb the ideal field described. One option is to ground the back side of the substrate to provide power dissipation, and force the electric field on the substrate surface with the resistor device to drop off linearly using a metal pattern near the resistive film.

Figure 1:
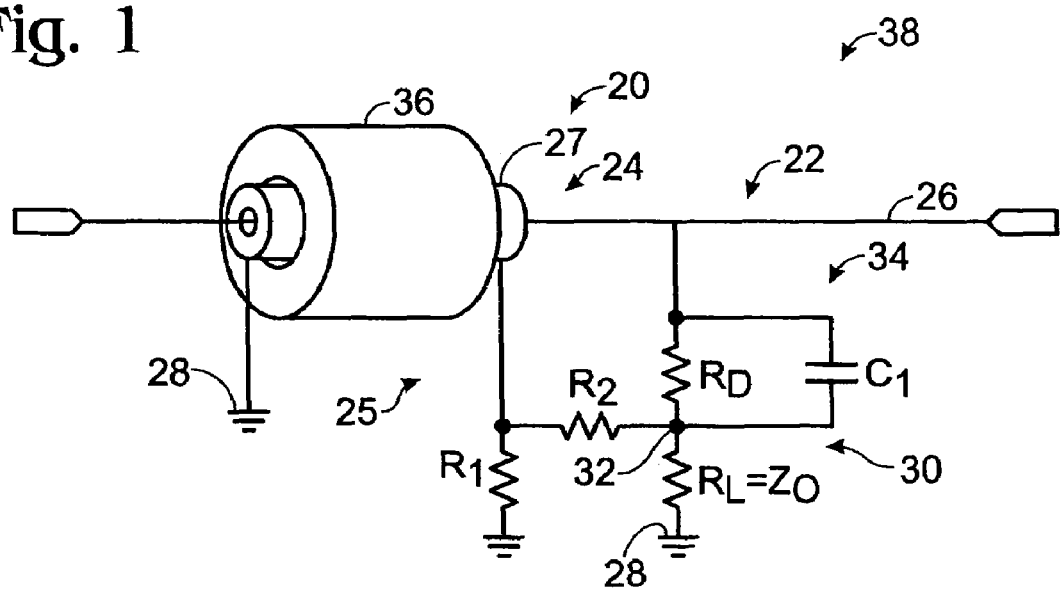
FIG. 1 is a circuit diagram showing a directional coupler including a first voltage divider.

A simplified example of a directional coupler 20 including a resistive voltage divider circuit 22 is illustrated in FIG. 1. Coupler 20 also includes a transmission line 24 and a current sensor 25. The transmission line, shown as a coaxial line, includes a signal conductor 26 carrying a signal relative to a reference or signal-return conductor 27. The signal-return conductor is connected to a circuit ground 28 directly at one end and indirectly through a resistor $R_1$ at the other end. The transmission line 24 may have a characteristic impedance $Z_0$, such as 50 ohms.

Divider circuit 22 may be used to sample a characteristic of a signal on the transmission line, such as the voltage or power level. Nodes between a plurality of resistors 30 provide points for sampling the signal. Resistors 30 include one or more divider resistors, represented as resistor $R_D$. A node 32 may be an output terminal to which a load impedance $R_L$ may be connected. The ratio of $R_L/(R_L+R_D)$ determines the relative value of the sample to that carried by transmission line 24. As an example, for a 40 dB coupler and $R_L=Z_0=50$ ohms, a value of $R_D=5000$ ohms produces a power level on node 32 that is about 1/10,000th of that on the transmission line. A parasitic or stray capacitance may exist between the resistor $R_D$ and ground. This stray capacitance may be compensated for with a parallel capacitor $C_1$ across resistor $R_D$. Resistor $R_D$ and capacitor $C_1$ form what is also referred to as an impedance device 34. Accordingly, impedance device 34, current sensor 25 and transmission line 24 form a directional coupler device 38.

Current sensor 25 includes a ferrite core 36 that raises the impedance on signal-return conductor 27. A resistor $R_2$, which may have an impedance the same as that of $R_L$, is connected to node 32. The other end of resistor $R_2$ is connected to the signal-return conductor and to resistor $R_1$. Resistor $R_1$, may have a relatively low value, such as 0.5 ohms.

A plan view of an example of a substrate-mounted embodiment 40 of impedance device 34 is illustrated in FIG. 2. As shown in the figure, impedance device 40 includes a dielectric layer 42, which may be a unitary substrate or a combination of layers of suitable material, such as solid or air. Layer 42 may include opposite faces, including exposed face 42a and a backside face not shown. A reference or ground conductor 44 may be disposed on all or part of the backside face. A planar resistor device 46, having an impedance $Z_D$, a conductor assembly 48, and an output terminal 50 are mounted on layer face 42a. The resistor device has a first, input end 46a connected to conductor assembly 48, and an opposite second, output end 46b connected to output terminal 50.

Conductor assembly 48 includes an input terminal portion 48a adapted to be connected to a signal line of a transmission line, as described with reference to FIG. 1. Assembly 48 also includes wings 48b and 48c extending along opposite sides 46c and 46d of the resistor device. The conductor assembly wings are spaced from the resistor device and provide capacitive coupling between the input terminal portion 48a and end 46a of the resistor device. The space 52 between each wing and resistor device is narrow adjacent to the input terminal portion of the conductor assembly, and increases progressively toward output end 46b. The capacitive coupling is accordingly stronger at the input end and weaker toward the output end. This capacitive coupling offsets capacitive coupling between the resistor device and ground, tending to make the divider functional over a broad frequency range and distributing the electric field more evenly along the divider. This planar approach has thermal performance provided by the backside ground.

Figure 3:
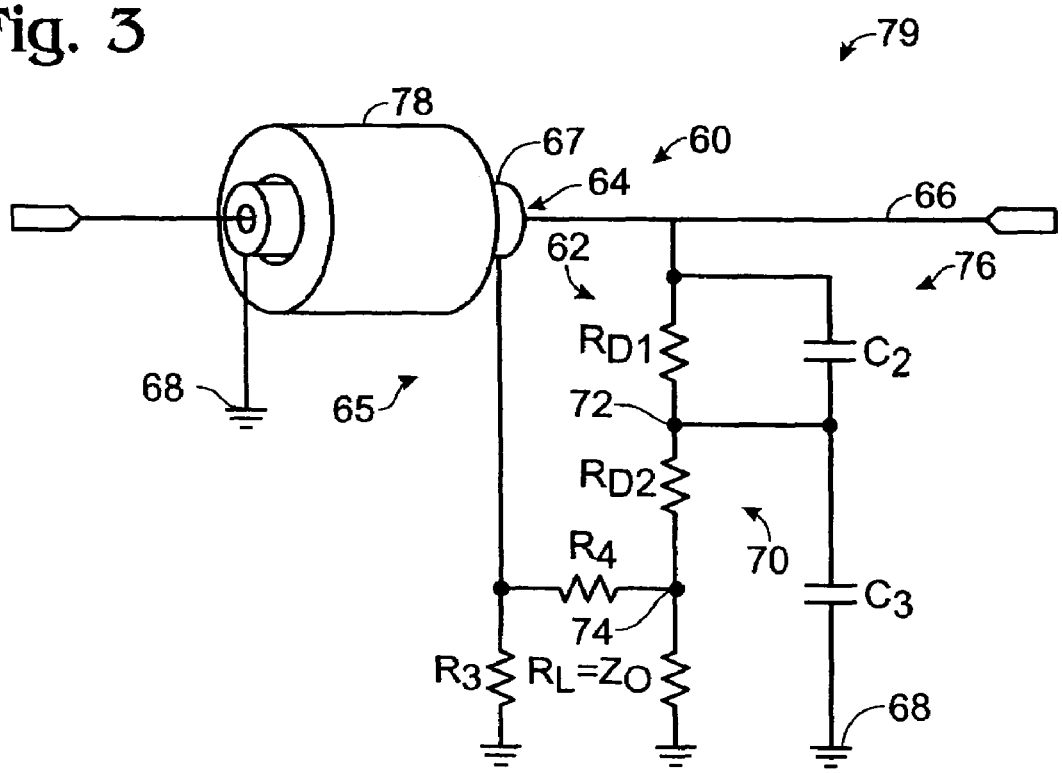
FIG. 3 is a circuit diagram of a directional coupler including a second voltage divider.

A further embodiment of a coupler circuit is illustrated as coupler circuit 60 in FIG. 3. Coupler circuit 60 is similar to divider 20 illustrated in FIG. 1 in that it includes a resistive voltage divider circuit 62, a transmission line 64, and a current sensor 65. The transmission line includes a signal conductor 66, which conducts a signal relative to a signal-return conductor 67. Conductor 67 is connected to a reference ground 68 directly at one end, and indirectly at the other end through resistor $R_3$. Divider circuit 62 includes a plurality 70 of resistors $R_{D1}$, $R_{D2}$ and $R_L$, separated by nodes 72 and 74, as shown. A capacitor $C_2$ is connected in parallel with resistor $R_{D1}$, and a shunt capacitor $C_3$ is connected between node 72 and ground. Accordingly, divider circuit 62 is also considered to be formed by an impedance device 76 and load impedance $R_L$. Current sensor 65 includes a ferrite core 78, resistor $R_3$ and a resistor $R_4$ similar to current sensor 25. Coupler circuit 60 without resistor $R_L$ is also referred to as a coupler device 79.

Coupler circuit 60 may be used to provide very weak coupling, say −50 or −60 dB, to the transmission line. Resistor $R_{D2}$ and capacitor $C_3$ compensate for capacitance to ground between both resistor $R_{D1}$ and capacitor $C_2$ and ground. For example, for $R_{D1}$=5000 ohms, $R_{D2}$ can have a value less than one tenth of $R_{D1}$, such as 450 ohms, without significantly changing the output loading. This configuration then may isolate the output on load impedance $R_L$ from the effect of the shunt compensating capacitance $C_3$ at high frequency.

A substrate-mounted embodiment 80 of impedance device 62 is illustrated in FIG. 4. Similar to impedance device 40, device 80 includes a dielectric layer 82, a ground conductor 84 on the back side of layer 82, a planar resistor device 86, a conductor assembly 88, and an output terminal 90. Resistor device 86 and conductor assembly 88 are coplanar, being formed on an exposed face 82a of the dielectric layer. Resistor device 86, has an input end 86a and an output end 86b, and an impedance $Z_D=Z_{D1}+Z_{D2}$. $Z_{D1}$, associated with input end 86a, corresponds generally to $R_{D1}$, and $Z_{D2}$, associated with output end 86b, corresponds to $R_{D2}$ of divider 62. Conductor assembly 88 includes an input terminal portion 88a and wings 88b and 88c extending along a portion of opposite sides 86c and 86d of the resistor device. Two portions 84a and 84b of ground conductor 84 extend onto surface 82a adjacent to and spaced from resistor device end 86b. These two ground conductor portions capacitively couple to the resistor device end, providing capacitance corresponding to capacitor $C_3$ of divider circuit 62.

In high power applications, the power dissipation capability of the resistor device is greater, the more uniform the current density is along the resistance $Z_{D1}$. As has been mentioned, the additional capacitance $C_2$ added to improve the current uniformity effectively adds to the capacitance already present from the input to the output. To compensate for this, resistance $Z_{D2}$ is added in series between resistance $Z_{D1}$ and the output terminal. Capacitance $C_2$ to ground at the intermediate connection, which causes the voltage at this intermediate node to fall off slightly with increasing frequency, tends to flatten the overall frequency response, while it causes slightly increased dissipation in the resistance towards the input end. Rather than add this resistance as a separate device and correspondingly add its complication to the circuit, the field plates do not extend along the output end, thereby under-compensating the low voltage end of the resistor device. This allows the last 500 to 1000 ohms of a 5000-ohm resistance device to sag in current density, thereby performing the required frequency compensation.

Figure 6:
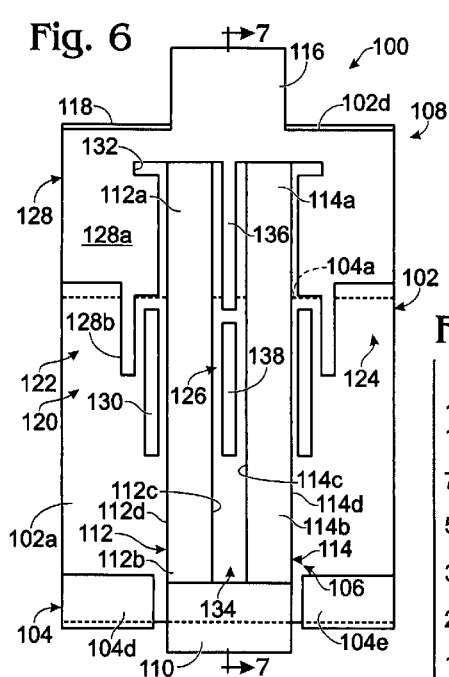
FIG. 6 is a plan view of the impedance device of FIG. 5.
Figure 7:
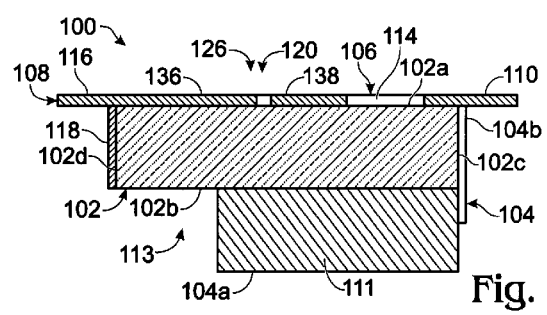
FIG. 7 is a cross section taken along the line 7—7 in FIG. 6.

A further compensated, substrate-based impedance device 100 is illustrated in FIGS. 5–7. Similar to divider circuit 80, device 100 is suitable for use in a voltage divider of a coupler circuit, and includes a dielectric layer 102, a ground conductor 104, a planar resistor device 106, a conductor assembly 108, and an output terminal 110. Dielectric layer 102 has a first pair of opposing parallel faces 102a and 102b, and a second pair of opposing parallel faces 102c and 102d. It is seen that faces 102a and 102b are orthogonal to faces 102c and 102d.

Ground conductor 104 includes a portion 104a, in the form of a metal base 111, extending along about two-thirds of the length of resistor device 106 adjacent to output terminal 110. An air layer 113 extends along the remainder of the backside of dielectric layer 102, along the end associated with conductor assembly 108. Ground conductor 104 includes portions 104b and 104c extending along dielectric layer face 102c, and portions 104d and 104e extending along layer face 102a on each side of output terminal 110.

Resistor device 106 includes parallel and spaced-apart, first and second resistor elements 112 and 114 formed as resistive films. The resistor elements have respective input ends 112a and 114a associated with conductor assembly 108, output ends 112b and 114b, opposing inner sides 112c and 114c, and outer sides 112d and 114d.

Conductor assembly 108 is more complex in this example. It includes an input terminal conductor element 116 that is connected to the input ends of the resistor elements, and that is adapted to be connected to a signal conductor of a transmission line, as has been described. Conductor element 116 extends partially beyond the edge of dielectric layer 102, as shown. The conductor assembly also includes an end plate conductor element 118. The end plate conductor element extends along layer face 102d and is connected to input terminal conductor element 116.

The conductor assembly also includes a compensation assembly 120 that is coplanar with and capacitively coupled to resistor device 106. Compensation assembly 120 includes first and second side portions 122 and 124, and intermediate portion 126. The side portions extend along and are spaced from the outer sides of the resistor elements. The side portions are mirror images of each other. Accordingly, side portion 122 is described in further detail, with the understanding that the description also applies to side portion 124.

Side portion 122 includes conductor elements 128 and 130. Conductor element 128 is connected to and extends from input terminal conductor element 116 along outer side 112d of resistor element 112. The conductor element 128 includes a wide portion 128a that extends along about one-third of the resistor element side and has a recess 132 adjacent to the terminus of the resistor element. A finger portion 128b extends further along the side of the resistor element to a point at about the middle of the resistor element.

Conductor element 130 extends parallel to the side of the resistor element between finger portion 128b and the side of the resistor element. Conductor element 130 thus forms an island capacitively coupled to the finger portion of conductor element 128 as well as to the resistor element. Conductor element 130 has a length that corresponds to one-half of a wavelength of a design operating frequency, half of which extends along finger portion 128b.

Intermediate conductor portion 126 extends into a gap 134 between and spaced from resistor elements 112 and 114. The intermediate portion includes an elongate conductor element 136 connected at one end to input terminal conductor element 116. Conductor element 136 is capacitively coupled to the two resistor elements and extends about one-third of the way along the resistor elements adjacent to input ends 112a and 114a. Conductor portion 126 further includes a conductor element 138 forming an island spaced from conductor element 136 and extending toward output terminal 110. Conductor element 138 thus is capacitively coupled to conductor element 136 as well as to the resistor element.

This planar approach has effective thermal performance, as the backside of the resistor is largely grounded. Moreover, the ground metal, ground conductor portions 104d and 104e, on the cold end of the resistor body close to the cold end (112b, 114b) of the resistor device, with clearance around the resistor output ends 112b and 114b. This helps to shield the cold end, reducing the shunt capacitance between the resistor device and ground, referred to as cross-resistor capacitance. Some cross-resistor capacitance is inevitable in a non-ideal layout. Field plates in the form of compensation assembly 120 on the surface 102a of the dielectric layer near the resistor device, and separated from it by varying distances, distribute the voltage along the resistor and also add cross-resistor capacitance. The smaller the field plates are and the more closely they are spaced, the less cross-resistor capacitance they produce. However, voltage breakdown can be an issue for very small gaps, so there is a limit on how small the gaps can be. Thus, the design is a compromise between non-uniform resistive drop along its length, which reduces frequency-response flatness and power dissipation, and excess cross-resistor capacitance, which tends to narrow the useful bandwidth. The larger the value of resistance in resistor device 106, and the larger the physical size of the resistor device, the more difficult it is to obtain a wide bandwidth for the divider circuit.

Figure 8:
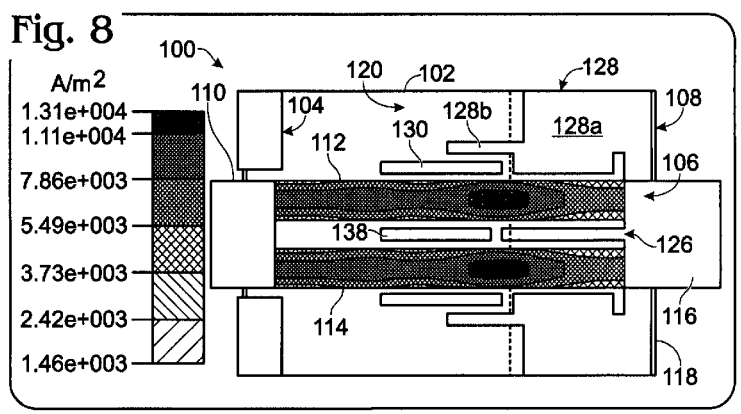

As has been mentioned, in high power applications, the power dissipation capability of the resistor device is greater the more uniform the current density is along the resistance $Z_{D1}$. FIGS. 8–12 illustrate representative plots of current density in amps per square meter at a frequency of 1 GHz along resistor elements 112 and 114 for different configurations of ground conductor 104 and compensation assembly 120. For ease of reference, common features of divider circuits in these figures are given the same reference numbers. FIG. 8 illustrates the current density for divider circuit 100 as illustrated in FIGS. 5–7. It is seen that the current density is relatively uniform, only varying between $1.3 \times e^4$ and $3.7 \times e^3$ amps per square meter.

FIG. 9 illustrates an impedance device 150 that is identical to divider circuit 100 except that it does not include finger portions 128b or island conductor elements 130 and 138. It is seen that the current density is generally uniform along the length of the resistor device, reaching a maximum value of about $1.8 \times e^4$ amps per square meter in a region about one-third of the length of the resistor device from the terminus of the input end. The current density tends to be less along the end edges, reaching a value of about $3.3 \times e^3$ amps per square meter.

FIG. 10 illustrates an impedance device 160 that is identical to impedance device 150 except that it does not include the portions of compensation assembly 120 extending along the sides of the resistor elements, leaving just the end metalization. The current density is higher at the input end and diminishes along about two-thirds of the length of the resistor device from a value of about $2.7 \times e^4$ amps per square meter to a value of about $3.0 \times e^3$ amps per square meter, beyond which it is generally uniform.

FIG. 11 illustrates an impedance device 170 that is identical to impedance device 160 except that it does not include any additional metal at the input end, other than input terminal conductor element 116. The current density drops off very rapidly from a maximum of about $4.8 \times e^4$ amps per square meter at the input end of the resistor elements to close to zero near the output end. The backside of the resistor device has no ground metal until about one-third of the distance to the output end of the resistor device. The air layer under the input end of the resistor device increases the frequency response, but degrades somewhat the thermal performance.

FIG. 12 illustrates an impedance device 180 that is identical to an impedance device 170 except that metal base 111 covers the entire backside of dielectric layer 102. The current density pattern is similar to that for divider circuit 170, but with a greater range. Specifically, the current density drops off very rapidly from a maximum of about $5.3 \times e^4$ amps per square meter at the input end of the resistor elements to close to zero about two-thirds of the way to the output end. The last third of the resistor elements have near zero current density. It will be appreciated that the high current density at the input of the resistor device can lead to failure of the resistor device and divider circuit 100 at high power levels.

Accordingly, while the inventions defined in the following claims have been particularly shown and described with reference to the foregoing preferred embodiments, those skilled in the art will understand that many variations may be made therein without departing from the spirit and scope of the inventions. Other combinations and sub-combinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present disclosure. The foregoing embodiments are illustrative, and no single feature or element is essential to all possible combinations that may be claimed in this or later applications. Where the claims recite "a" or "a first" element or the equivalent thereof, such claims should be understood to include one or more such elements, neither requiring nor excluding two or more such elements. Further, cardinal indicators, such as first, second or third, for identified elements are used to distinguish between the elements, and do not indicate a required or limited number of such elements, nor does it generally indicate a particular position or order of such elements, unless otherwise specifically stated.

What is claimed is:

1. A radio-frequency impedance device comprising:
    a dielectric layer;
    an input terminal mounted on the dielectric layer and adapted to be connected to a signal conductor of a transmission line;
    an output terminal mounted on the dielectric layer in spaced relationship to the input terminal and adapted to be connected to a load impedance;
    a reference conductor mounted on the dielectric layer in spaced relationship to the input terminal and the output terminal;
    a first resistor device mounted on the dielectric layer in spaced relationship to the reference conductor, the resistor device having a first resistor end coupled to the input terminal and a second resistor end coupled to the output terminal; and
    a conductor assembly mounted on the dielectric layer, coupled to the input terminal and extending adjacent to at least a portion of the resistor device between the first and second resistor ends, where the resistor device and the conductor assembly are coplanar.

2. The impedance device of claim 1, in which the conductor assembly includes a first element extending along the resistor device, from a position adjacent to the first resistor end, and toward the second resistor end.

3. The impedance device of claim 2, in which the conductor assembly further includes a second element spaced from and coupled to the first element and the resistor device.

4. The impedance device of claim 3, in which the first and second elements extend adjacent to at least one-fourth of the resistor device.

5. The impedance device of claim 4, in which the first and second elements extend adjacent to about one-third of the resistor device.

6. The impedance device of claim 3, in which the first resistor device has opposite sides, and the first and second elements extend along one side of the resistor device, the conductor assembly further including third and fourth elements extending along the other side of the resistor device, the third element adjacent to and spaced from the resistor device and extending from adjacent to the first resistor end toward the second resistor end, and the fourth element being spaced from and coupled to each of the first element and the resistor device.

7. The impedance device of claim 6, in which the resistor device includes first and second parallel resistors, and the conductor assembly further includes a fifth element spaced from and extending between the first and second resistors.

8. The impedance device of claim 1, in which the resistor device includes first and second parallel resistors, and the conductor assembly includes a conductor element coupled to the input terminal and spaced from and extending between the first and second resistors.

9. The impedance device of claim 1, in which the conductor assembly is capacitively coupled to the resistor device.

10. The impedance device of claim 1, in which the dielectric layer has opposite first and second layer faces, the resistor device is mounted on the first layer face, and the reference conductor extends along a portion of the second layer face opposite only a portion of the resistor device spaced from the first resistor end.

11. The impedance device of claim 10, in which the dielectric layer further has opposite third and fourth layer faces transverse to the first and second layer faces, the conductor assembly extending along the third layer face, and the reference conductor further extends along the fourth layer face.

12. The impedance device of claim 11, in which the reference conductor further extends from the fourth layer face onto the first layer face adjacent to the second resistor end.

13. The impedance device of claim 1, in which the dielectric layer has opposite first and second layer faces and a third layer face transverse to the first and second layer faces, the resistor device is mounted on the first layer face, and the reference conductor extends along at least a portion of the third layer face.

14. The impedance device of claim 13, in which the dielectric layer has a fourth layer face opposite the third layer face, and the conductor assembly further extends along at least a portion of the fourth layer face.

15. The impedance device of claim 14, in which the reference conductor further extends from the third layer face onto the first layer face adjacent to the second resistor end.

16. The impedance device of claim 1, where the reference conductor extends adjacent to and spaced from the second end of the first resistor device.

17. The impedance device of claim 1, further comprising a second resistor device coupling the second resistor end of the first resistor device to the output terminal, and a capacitance device coupling the second resistor end of the first resistor device to the reference conductor.

18. A directional coupler device comprising:
    an impedance device according to claim 1;
    a transmission line having a signal conductor connected to the input terminal, and a signal-return conductor connected to the reference conductor; and
    a current sensor coupled to the impedance device and the transmission line.

19. A radio-frequency impedance device comprising:
    a dielectric layer;
    an output terminal positioned on the dielectric layer and adapted to be connected to a load impedance;
    a reference conductor positioned on the dielectric layer and adapted to be connected to a reference voltage;
    a first conductor positioned on the dielectric layer spaced from the reference conductor, and adapted to be connected to a signal conductor of a transmission line; and
    an elongate planar first resistor device positioned on the dielectric layer transverse to the first conductor and capacitively coupled to and extending in spaced relationship to the reference conductor, the first resistor device having a first resistor end connected to the first conductor and a second resistor end coupled to the output terminal;
    the first conductor and the reference conductor each including a portion extending in a plane transverse to the resistor device.

20. The impedance device of claim 19, in which the first resistor device has opposite sides, the first conductor further extending along each side of the first resistor device from the first resistor end toward the second resistor end adjacent to and spaced from the first resistor device.

21. The impedance device of claim 20, further comprising a second conductor positioned on the dielectric layer, and spaced from and coupled to each of the first conductor and the first resistor device.

22. The impedance device of claim 19, further comprising a second resistor device coupling the second resistor end of the first resistor device to the output terminal, and a capacitance device coupling the second resistor end of the first resistor device to the reference conductor.

23. A directional coupler device comprising:

an impedance device according to claim 19; a transmission line having a signal conductor connected to the first conductor, and a signal-return conductor connected to the reference conductor; and a current sensor coupled to the impedance device and the transmission line.

24. A radio-frequency directional coupler device comprising:

a transmission line having a signal conductor and a signal-return conductor;

a dielectric layer having first and second layer faces opposite each other, and third and fourth layer faces opposite each other, the first and second layer faces being orthogonal to the third and fourth layer faces;

an output terminal mounted on the first layer face of the dielectric layer in spaced relationship to the input terminal and adapted to be connected to a load impedance;

a current sensor coupled to the transmission line and to the output terminal;

a first resistor device mounted on the first layer face of the dielectric layer, the resistor device having opposite sides, a first resistor end, and a second resistor end coupled to the output terminal;

a conductor assembly mounted on the dielectric layer, adapted to be connected to the signal conductor and to the first resistor end, and including a first portion extending along the first layer face on opposite sides of the resistor device adjacent to at least the first resistor end, and a second portion extending along the fourth layer face; and a reference conductor connected to the signal-return conductor, and mounted on the dielectric layer in spaced relationship to the input terminal, the output terminal, the first resistor device and the conductor assembly, the reference conductor extending from adjacent to the second resistor end of the resistor device along the third layer face, and along the second layer face opposite the resistor device from the second resistor end to a position short of the first resistor end.

* * * * *